United States Patent
Cheng et al.

(10) Patent No.: US 7,157,351 B2
(45) Date of Patent: Jan. 2, 2007

(54) OZONE VAPOR CLEAN METHOD

(75) Inventors: Chung-Long Cheng, Hsin-Chu (TW); Kong-Beng Thei, Po-Sham Village, Hsin-Chu Country (TW); Jung-Hui Kao, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 49 days.

(21) Appl. No.: 10/850,747

(22) Filed: May 20, 2004

(65) Prior Publication Data

US 2005/0260827 A1 Nov. 24, 2005

(51) Int. Cl.
*H01L 21/76* (2006.01)

(52) U.S. Cl. .................... 438/435; 438/424; 438/436; 438/437; 438/706; 438/745; 257/E21.002

(58) Field of Classification Search ................ 438/424, 438/435, 436, 437, 706, 745
See application file for complete search history.

(56) References Cited

U.S. PATENT DOCUMENTS 6,848,455 B1 * 2/2005 Shrinivasan et al. ......... 134/1.3
6,933,206 B1 * 8/2005 Beintner et al. ............ 438/435

* cited by examiner

*Primary Examiner*—Michael Trinh
*Assistant Examiner*—Christy Novacek
(74) *Attorney, Agent, or Firm*—Tung & Associates

(57) ABSTRACT

A method for cleaning and forming an oxide film on a surface, particularly a silicon surface. The surface is initially cleaned and then exposed to ozone vapor, which forms the oxide film on the surface. The method is particularly useful for forming a pre-liner oxide film on trench surfaces in the fabrication of STI (shallow trench isolation) structures.

18 Claims, 1 Drawing Sheet

OZONE VAPOR CLEAN METHOD

FIELD OF THE INVENTION

The present invention relates to methods for cleaning semiconductor wafer substrates in the fabrication of integrated circuits. More particularly, the present invention relates to a method for cleaning substrates which includes exposing the substrates to ozone vapor to facilitate the growth of a thin, high-quality oxide layer on the substrates.

BACKGROUND OF THE INVENTION

The fabrication of various solid state devices requires the use of planar substrates, or semiconductor wafers, on which integrated circuits are fabricated. The final number, or yield, of functional integrated circuits on a wafer at the end of the IC fabrication process is of utmost importance to semiconductor manufacturers, and increasing the yield of circuits on the wafer is the main goal of semiconductor fabrication. After packaging, the circuits on the wafers are tested, wherein non-functional dies are marked using an inking process and the functional dies on the wafer are separated and sold. IC fabricators increase the yield of dies on a wafer by exploiting economies of scale. Over 1000 dies may be formed on a single wafer which measures from six to twelve inches in diameter.

Various processing steps are used to fabricate integrated circuits on a semiconductor wafer. These steps include sequential deposition of conductive and insulative layers on the silicon wafer substrate; formation of a photoresist or other mask such as titanium oxide or silicon oxide, in the form of the desired metal interconnection pattern, using standard lithographic or photolithographic techniques; subjecting the wafer substrate to a dry etching process to remove material from one or more conducting layers from the areas not covered by the mask, thereby etching the conducting layer or layers in the form of the masked pattern on the substrate; removing or stripping the mask layer from the substrate typically using reactive plasma and chlorine gas, thereby exposing the top surface of the conductive interconnect layer; and cooling and drying the wafer substrate by applying water and nitrogen gas to the wafer substrate.

The numerous processing steps outlined above are used to cumulatively apply multiple electrically conductive and insulative layers on the wafer and pattern the layers to form the circuits. Additional techniques, such as dual damascene processes, are used to form conductive vias which establish electrical contact between vertically-spaced conductive lines or layers in the circuits. The finished semiconductor product includes microelectronic devices including transistors, capacitors and resistors that form the integrated circuits on each of multiple die on a single wafer.

The fabrication of IC devices on a substrate frequently involves electrically isolating adjacent devices on a substrate to prevent short-circuiting of the devices. Shallow trench isolation (STI) is a widely-used technique to isolate adjacent devices fabricated on a substrate. In STI, spaced-apart trench oxides are formed by initially etching trenches in the substrate typically using a dry etching process. A pre-liner oxide film is typically formed on the substrate surfaces in the trenches. A liner oxide layer is then grown on the surfaces of the trenches, typically using thermal processing techniques. The trenches are then filled with CVD oxide and planarized using chemical mechanical planarization (CMP), after which the devices are fabricated. A thin gate oxide on the surface of the substrate extends between the spaced-apart trench oxides.

Silicon oxide ($SiO_2$) is frequently used for its insulating properties as a gate oxide or dielectric in the fabrication of IC devices. As the dimensions of device circuits on substrates become increasingly smaller, the gate dielectric thickness must decrease proportionately in field effect transistors (FETs) to approximately 3 to 3.5 nonometers. Accordingly, device performance and reliability can be adversely affected by such factors as interfacial defects, defect precursors and diffusion of dopants through gate dielectrics, as well as unintended variations in thickness in the gate oxide layer among central and peripheral regions of the layer.

In the semiconductor fabrication industry, minimization of particle contamination on semiconductor wafers increases in importance as the integrated circuit devices on the wafers decrease in size. With the reduced size of the devices, a contaminant having a particular size occupies a relatively larger percentage of the available space for circuit elements on the wafer as compared to wafers containing the larger devices of the past. Moreover, the presence of particles in the integrated circuits compromises the functional integrity of the devices in the finished electronic product. Consequently, after the STI trenches are etched in the substrate and before the liner oxide is deposited in the trenches, the substrate is typically subjected to a cleaning process, such as an RCA cleaning process, to remove particles from the trenches and from the substrate.

The RCA clean process is widely used in the semiconductor industry and includes sequential immersion of substrates in two different chemical baths, commonly known as Standard Clean 1 (SC-1) and Standard Clean 2 (SC-2). The SC-1 bath is an alkaline solution used to remove particles and organic materials from the wafer and includes a mixture of ammonium hydroxide, hydrogen peroxide and DI water. The SC-2 bath is used to remove metals from the surface of the wafer and includes a mixture of hydrochloric acid, hydrogen peroxide and DI water.

Typically, wafers are routed in lots through the STI process. As the cleaning process is carried out to remove particles from the trenches, a pro-liner oxide film for the liner oxide layer is formed on the wafer surface in the trenches by introducing oxygen into the cleaning chamber. Ozone ($O_3$) has been provided in the liquid-state in deionized water used to clean the wafers, to facilitate formation of the pro-linor oxide film on the water surface in the trenches. However, this mode of bringing oxygen into contact with the wafer surface has resulted in the formation of pre-liner oxide films of non-uniform thickness.

The wafers are frequently subjected to a "stand-by" or waiting period after placement into the cleaning chamber and prior to commencement of the cleaning and oxide liner formation process. However, because the interior of the cleaning chamber is characterized by relatively low temperatures and low oxygen purity, a low-quality and non-uniform pre-liner oxide film forms on the wafer surface in the trenches. This causes breakdown of the trench oxide subsequently formed on the liner oxide layer in the trenches. Consequently, devices fabricated on the substrate exhibit undesired junction leakage and a narrow device $V_t$. Accordingly, a new and improved method is needed for forming a pre-liner oxide film on wafer surfaces, particularly in the fabrication of trench oxide structures.

An object of the present invention is to provide a novel method which is suitable for forming an oxide film on a surface.

Another object of the present invention is to provide a novel method which is suitable for forming an oxide film on a surface, particularly a silicon surface, in a variety of applications.

Still another object of the present invention is to provide a novel method which is suitable for forming a pre-liner oxide film on trench surfaces of a substrate in the fabrication of shallow trench isolation (STI) structures.

Yet another object of the present invention is to provide a novel cleaning method which enhances device performance and reliability in the fabrication of semiconductor devices and contributes to GOI (gate oxide integrity) in 300 mm wafer technology.

A still further object of the present invention is to provide a novel cleaning and oxide film-forming method which is characterized by a wide process control window in the fabrication of high aspect ratio STI trenches.

Another object of the present invention is to provide a novel method which enhances uniformity in oxide films on substrates.

Yet another object of the present invention is to provide a novel oxide film forming method which includes providing a substrate in contact with ozone vapor while subjecting the substrate to a cleaning process.

Another object of the present invention is to provide a novel cleaning and oxide film forming method which is characterized by expedited process time, low cost and high process throughput.

SUMMARY OF THE INVENTION

In accordance with these and other objects and advantages, the present invention is generally directed to a new and improved method for cleaning and forming an oxide film on a surface, particularly a silicon surface. The method is applicable to forming a thin oxide film of high quality on a silicon surface in the fabrication of semiconductor integrated circuits on a wafer substrate. The method is particularly beneficial in the formation of a pre-liner oxide film on silicon trench surfaces, preparatory to subsequent formation of a liner oxide layer on the pre-liner oxide film and formation of a trench oxide on the liner oxide layer, in the fabrication of shallow trench isolation (STI) structures. The method includes providing a substrate and subjecting the substrate to a cleaning process while exposing the substrate to an ozone vapor.

The method of the present invention is effective in forming a pre-liner oxide film on a typically silicon substrate, particularly on the surfaces of trenches etched into the substrate, for the subsequent formation of a liner oxide layer on the pre-liner oxide film. A trench-filling trench oxide is then deposited on the liner oxide layer. The ozone vapor is brought into contact with the substrate as the substrate is subjected to a cleaning process to remove from the substrate particles which remain from the trench-etching process.

In a typical embodiment, the substrate is subjected to a standard RCA clean process as the ozone vapor is introduced into the cleaning chamber. Preferably, the substrate is first subjected to the cleaning process and then exposed to the ozone vapor. The ozone vapor may be introduced into the cleaning chamber at a flow rate of typically about 100~500 sccm. Most preferably, the ozone vapor is introduced into the cleaning chamber at a flow rate of typically about 200~300 sccm.

According to a typical method of the present invention, a shallow trench isolation (STI) trench is etched in a typically silicon substrate. The substrate is then subjected to a cleaning process, such as an RCA clean process. Next, the substrate is exposed to ozone vapor, which is introduced into the cleaning chamber, to form a pre-liner oxide film on the substrate surfaces in the trenches. The substrate is removed from the cleaning chamber and a liner oxide layer is provided on the pre-liner oxide film, typically using conventional rapid thermal anneal (RTA) techniques. After the trenches are filled with trench oxide, the IC devices are fabricated on the substrate.

BRIEF DESCRIPTION OF THE DRAWINGS

The invention will now be described, by way of example, with reference to the accompaninq drawings, in which.

DETAILED DESCRIPTION OF THE INVENTION

Figure 1:
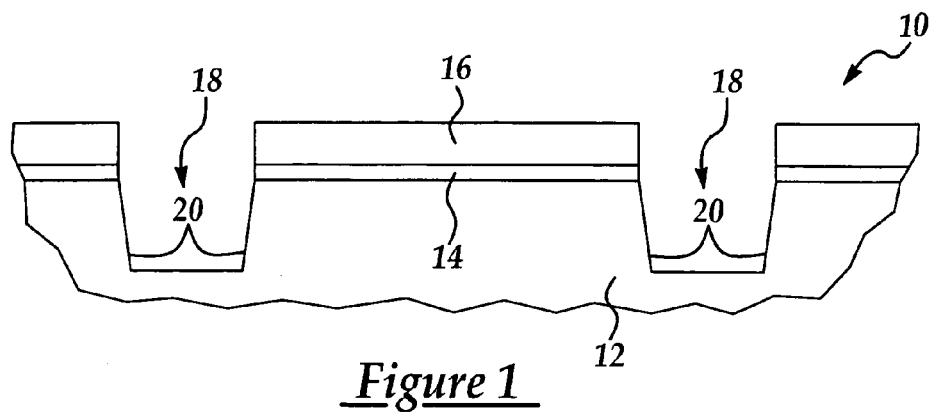
FIG. 1 is a cross-section of a substrate with a pair of STI trenches etched therein.

The present invention has particularly beneficial utility in the formation of a pre-liner oxide film on silicon surfaces in a trench etched into a substrate for the fabrication of STI (shallow trench isolation) structures on the substrate. However, the invention is not so limited in application, and while references may be made to such STI structures, the present invention is more generally applicable to forming an oxide film on a substrate in a variety of semiconductor fabrication applications, as well as applications in other industries.

The present invention includes a new and improved method for cleaning a substrate and forming a thin oxide layer or film on the substrate. The invention is suitably adapted for forming an oxide layer or film on a silicon surface. The method may be used to form a thin oxide film of high quality and uniform thickness on a silicon surface in the fabrication of semiconductor integrated circuits on a wafer substrate.

In the fabrication of shallow trench isolation (STI) structures, the method is particularly applicable to the formation of a pre-liner oxide film on silicon trench surfaces. A liner oxide layer and a trench-filling trench oxide, respectively, can then be formed on the pre-liner oxide film to form the STI trenches. The pre-liner oxide film and liner oxide layer provide a high-quality interface between the trench surface and the trench oxide deposited in the trench on the liner oxide layer.

The pre-liner oxide films formed according to the method of the present invention contribute to the fabrication of STI structures which eliminate or minimize junction leakage and contribute to a high device $V_t$ stability. As compared to conventional methods for forming pre-liner oxide films on substrates, the method of the present invention significantly enhances device performance and reliability. Furthermore, in the fabrication of high-aspect ratio STI trenches, the present invention is characterized by a wider process control window and shorter process time. The method is characterized by low cost and contributes to high process tool throughput.

The present invention utilizes ozone vapor to clean and deposit a thin, high-quality and substantially uniform pre-liner oxide film on a typically silicon substrate surface, such as in the fabrication of STI structures. The ozone is typically mixed with water vapor to form the ozone vapor, which is brought into contact with the substrate. In a typical embodiment, the substrate is subjected to a standard RCA clean process or other clean process as the ozone vapor is introduced into the cleaning chamber. Preferably, the substrate is first subjected to the cleaning process and then exposed to the ozone vapor. The ozone vapor may be introduced into the cleaning chamber at a flow rate of typically about 100~500 sccm. Most preferably, the ozone vapor is introduced into the cleaning chamber at a flow rate of typically about 200~300 sccm.

According to a typical method of the present invention, STI trenches are initially etched in a typically silicon substrate. The substrate is then placed in a substrate cleaning chamber, such as a DNS (Dai Nippon Screen) wet clean chamber, for example. The substrate is then subjected to a cleaning process, such as an RCA clean process, to remove particles remaining from the trench-etching and photoresist-stripping step. Next, the substrate is exposed to the ozone vapor, which is introduced into the cleaning chamber, to form a pre-liner oxide film on the substrate surfaces in the trenches. The substrate is removed from the cleaning chamber and a liner oxide layer is formed on the pre-liner oxide film. This can be accomplished through the use of conventional thermal processing techniques. After the trenches are filled with trench oxide, the IC devices are fabricated on the substrate.

Figure 2:
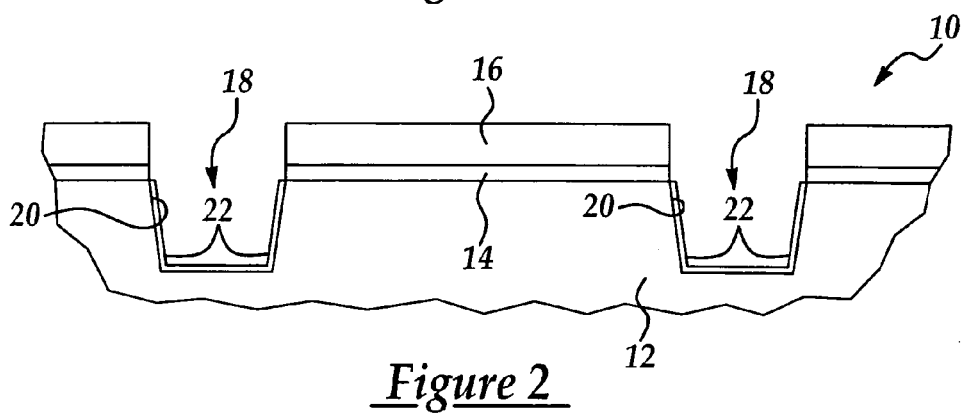
FIG. 2 is a cross-section of the substrate of FIG. 1, with an oxide pre-liner oxide film formed on the surfaces of the STI trenches according to the process of the present invention.
Figure 3:
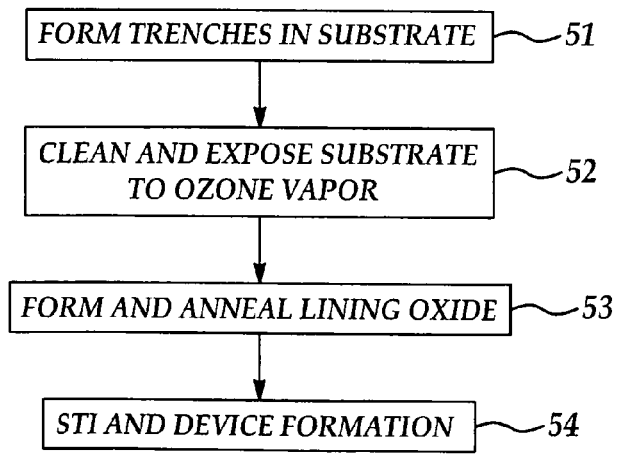
FIG. 3 is a flow diagram illustrating a typical flow of process steps according to the method of the present invention.

Referring to FIGS. 1–3, according to the method of the present invention, an STI (shallow trench isolation) structure 10 is formed in a typically silicon substrate 12, as indicated in step S1 of FIG. 3. Before trenches 18 are etched in the substrate 12, a pad oxide layer 14 is initially formed on the surface of the substrate 12. The pad oxide layer 14 has a thickness of typically about 110 angstroms and may be formed in a high-temperature oxidation furnace, such as an RTP (rapid thermal processing) chamber, for example. The purpose of the pad oxide layer 14 is to form a barrier to protect active regions on the substrate 12 from chemical contamination during the subsequent nitride-stripping step.

As further shown in FIG. 1, a silicon nitride layer 16 is formed on the pad oxide layer 14. The silicon nitride layer 16 has a thickness of typically about 1,625 angstroms and is deposited on the pad oxide layer 14 typically in an LPCVD (low-pressure chemical vapor deposition) furnace. In the LPCVD furnace, ammonia and dichlorosilane gases react to form the silicon nitride ($Si_3N_4$) layer 16 on the pad oxide layer 14. The silicon nitride layer 16 functions both as a durable masking material, which protects active regions on the substrate 12 during STI oxide deposition, and as a polish-stop material during the subsequent chemical mechanical planarization (CMP) step.

After the silicon nitride layer 16 is deposited on the pad oxide layer 14, the trenches 18 are etched through the silicon nitride layer 16 and underlying pad oxide layer 14, and into the substrate 12. First, a photolithography step is carried out in which a photolithography mask (not shown) is applied to the silicon nitride layer 16 of the STI structure 10 to shield areas of the structure 10 which are not to be etched and expose the isolation regions on the structure 10 in which the trenches 18 are to be etched. Next, the trenches 18 are formed, typically using a dry plasma etch process, in which high-powered radio frequency (RF) energy ionizes a fluorine- or chlorine-based gas inside a vacuum chamber. The resulting plasma etches the isolation regions which are not covered by the photolithography mask, forming the trenches 18 in the silicon substrate 12. Trench surfaces 20 are exposed through the trenches 18.

After the trenches 18 are etched in the substrate 12, the photoresist mask (not shown) is stripped from the silicon nitride layer 16. The STI structure 10 is then subjected to a wet cleaning process to remove particles remaining on the STI structure 10 as a result of the etching and photoresist stripping steps, as indicated in step S2 of FIG. 3. The wet cleaning process is typically an RCA clean process, in which the STI structure 10 is cleaned in a series of chemical baths in a DNS (Dai Nippon Screen) cleaner, for example.

In a typical embodiment of the invention, the substrate 12 having the STI structure 10 is cleaned with HF (hydrogen fluoride), followed by rinsing with de-ionized water; cleaning using an APM (ammonia-hydrogen peroxide mixture) solution; rinsing with de-ionized water; cleaning using an HPM (hydrochloric acid-hydrogen peroxide mixture) solution; and rinsing by de-ionized water, respectively. However, it is understood that alternative methods and cleaning solutions known by those skilled in the art may be used to remove post-etching and PR stripping particles from the substrate and STI structure 10.

As further indicated in step S2, and as shown in FIG. 2, a pre-liner oxide film 22 is next formed on the exposed trench surfaces 20 in each of the trenches 18. According to the method of the present invention, this step is typically carried out in the cleaning chamber or system in which the cleaning and rinsing process of step S2, described herein above, is carried out. Formation of the pre-liner oxide film 22 is accomplished by first mixing ozone ($O_3$) with water vapor to form an ozone vapor and then introducing the ozone vapor into the cleaning chamber. Preferably, the ozone vapor is introduced into the cleaning chamber or system at a flow rate of typically about 100~500 sccm. Most preferably, the ozone vapor is introduced into the cleaning chamber or system at a flow rate of typically about 200~300 sccm. The substrate 12 is exposed to the ozone vapor for a period of typically about 2~3 minutes to form a pre-liner oxide film 22 having a thickness of typically about 20~500 Å on the trench surfaces 20.

Figure 2A:
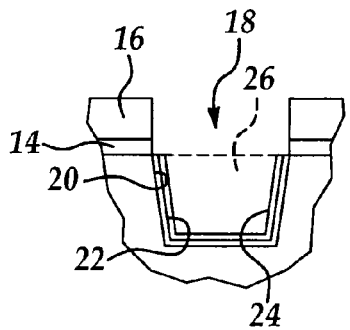
FIG. 2A is a cross-section of one of the STI trenches of FIG. 2, with a liner oxide layer formed on the pre-liner oxide film and a trench oxide (in phantom) filling the trench.

As indicated in step S3, and as shown in FIG. 2A, a liner oxide layer 24 is then deposited on the pre-liner oxide film 22 in the trenches 18. This is carried out by removing the substrate 12 from the cleaning chamber and placing the substrate 12 in a high-temperature oxidation furnace. In the furnace, a liner oxide layer 24 having a thickness of typically about 100~200 angstroms, and preferably, about 150 angstroms, is formed on the pre-liner oxide film 22. The liner oxide layer 24 is then annealed at a temperature of typically about 1,100 degrees C. The liner oxide layer 24, along with the pre-liner oxide film 22, enhances the interface between the typically silicon trench surfaces 20 and the trench oxide 26 to subsequently fill each trench 18, as shown in FIG. 2A and hereinafter described.

As indicated in step S4 of FIG. 3 and shown in FIG. 2A, the STI structure 10 is completed by filling in each of the trenches 18 with trench oxide 26, after which IC devices (not shown) are fabricated on the substrate 12. The trench oxide 26 is deposited in each trench 18, onto the liner oxide layer 24, typically in diffusion using an LPCVD (low-pressure chemical vapor deposition) chamber or furnace or in thin films using any of a variety of oxide CVD systems known by those skilled in the art. After the trench oxide 26 is deposited in the trenches 18, the trench oxide 26 is planarized, typically using CMP, and the silicon nitride layer 16 and pad oxide layer 14 are removed from the STI structure 10.

While the preferred embodiments of the invention have been described above, it will be recognized and understood that various modifications can be made in the invention and the appended claims are intended to cover all such modifications which may fall within the spirit and scope of the invention.

What is claimed is:

1. A method of forming a uniform thickness oxide film on a surface, comprising the steps of:
    providing an ozone vapor by mixing water vapor with ozone;
    cleaning said surface; and
    then contacting said surface with said ozone vapor to form a first oxide film on said surface;
    then, forming a second oxide film on said first oxide film.

2. The method of claim 1 wherein said surface comprises silicon.

3. The method of claim 2 wherein said providing an ozone vapor comprises the steps of providing water vapor, providing ozone, and preparing said ozone vapor by mixing said water vapor with said ozone.

4. The method of claim 1 wherein said cleaning said surface comprises the steps of providing a cleaning solution, exposing said surface to said cleaning solution, providing de-ionized water, and rinsing said surface with said de-ionized water.

5. The method of claim 4 wherein said providing an ozone vapor comprises the steps of providing water vapor, providing ozone, and preparing said ozone vapor by mixing said water vapor with said ozone.

6. The method of claim 4 wherein said surface comprises silicon.

7. The method of claim 6 wherein said providing an ozone vapor comprises the steps of providing water vapor, providing ozone, and preparing said ozone vapor by mixing said water vapor with said ozone.

8. A method of forming on trench surfaces in a substrate, comprising the steps of:
    exposing said trench surfaces by etching a trench in said substrate;
    providing an ozone vapor;
    cleaning said trench surfaces; and
    then contacting said trench surfaces with said ozone vapor to form a pre-liner oxide film;
    then thermally growing an oxide liner on said pre-liner oxide film.

9. The method of claim 8 wherein said providing an ozone vapor comprises the steps of providing water vapor, providing ozone, and preparing said ozone vapor by mixing said water vapor with said ozone.

10. The method of claim 8 wherein said substrate comprises silicon.

11. The method of claim 10 wherein said providing an ozone vapor comprises the steps of providing water vapor, providing ozone, and preparing said ozone vapor by mixing said water vapor with said ozone.

12. The method of claim 8 wherein said cleaning said trench surfaces comprises the steps of exposing said trench surfaces to hydrogen fluoride, rinsing said trench surfaces, exposing said trench surfaces to an ammonia-hydrogen peroxide mixture, rinsing said trench surfaces, exposing said trench surfaces to a hydrochloric acid-hydrogen peroxide mixture, and rinsing said trench surfaces, respectively.

13. The method of claim 12 wherein said providing an ozone vapor comprises the steps of providing water vapor, providing ozone, and preparing said ozone vapor by mixing said water vapor with said ozone.

14. The method of claim 12 wherein said substrate comprises silicon.

15. The method of claim 14 wherein said providing an ozone vapor comprises the steps of providing water vapor, providing ozone, and preparing said ozone vapor by mixing said water vapor with said ozone.

16. A method of fabricating a shallow trench isolation structure, comprising the steps of:
    etching a trench having trench surfaces in said substrate;
    providing an ozone vapor by mixing water vapor with ozone;
    cleaning said trench surfaces;
    then providing a pre-liner oxide film on said trench surfaces by contacting said trench surfaces with said ozone vapor;
    then providing a liner oxide layer on said pre-liner oxide film; and
    providing a trench oxide on said liner oxide layer in said trench.

17. The method of claim 16 wherein said substrate comprises silicon.

18. The method of claim 16 wherein said cleaning said trench surfaces comprises the steps of exposing said trench surfaces to hydrogen fluoride, rinsing said trench surfaces, exposing said trench surfaces to an ammonia-hydrogen peroxide mixture, rinsing said trench surfaces, exposing said trench surfaces to a hydrochloric acid-hydrogen peroxide mixture, and rinsing said trench surfaces, respectively.

* * * * *